United States Patent
Turbovich et al.

(10) Patent No.: US 11,748,539 B1
(45) Date of Patent: Sep. 5, 2023

(54) CONVERTING ANALOG VARIABLE DELAY IN REAL NUMBER MODELING CODE TO CYCLE-DRIVEN SIMULATION INTERFACE CODE

(71) Applicant: Cadence Design Systems, Inc., San Jose, CA (US)

(72) Inventors: Ophir Turbovich, Haifa (IL); Yosinori Watanabe, Lafayette, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 882 days.

(21) Appl. No.: 15/718,775

(22) Filed: Sep. 28, 2017

(51) Int. Cl.
*G06F 30/33* (2020.01)

(52) U.S. Cl.
CPC .................................. *G06F 30/33* (2020.01)

(58) Field of Classification Search
CPC ... G06F 17/5059; G06F 30/33; G06F 17/5022; G06F 17/5036; G06F 17/504; G06F 17/5031
See application file for complete search history.

(56) References Cited

U.S. PATENT DOCUMENTS

| | | | | |
|---|---|---|---|---|
| 5,230,061 A * | 7/1993 | Welch | .............. | G06N 5/046 706/903 |
| 6,075,936 A * | 6/2000 | Mori et al. | .......... | G06F 17/5022 703/13 |
| 6,606,588 B1 * | 8/2003 | Schaumont et al. | | G06F 17/5022 703/15 |
| 7,131,093 B1 * | 10/2006 | Aden | .............. | G06F 17/5022 716/108 |
| 8,732,630 B1 * | 5/2014 | Kolpekwar et al. | | G01R 31/318314 716/101 |
| 9,501,592 B1 * | 11/2016 | Kolpekwar et al. | | G06F 17/5036 |
| 10,133,837 B1 * | 11/2018 | Turbovich et al. | | G06F 17/5027 |
| 10,262,088 B1 * | 4/2019 | Turbovich et al. | | G06F 17/5036 |
| 10,262,095 B1 * | 4/2019 | Turbovich et al. | | G06F 17/5063 |
| 10,380,294 B1 * | 8/2019 | Spratt et al. | ........ | G06F 17/5036 |

(Continued)

OTHER PUBLICATIONS

Kulkarni, Dhanashree R. Improved model generation and property specification for analog/mixed-signal circuits. The University of Utah, 2013. 68 pages (Year: 2013).*

*Primary Examiner* — Bijan Mapar
(74) *Attorney, Agent, or Firm* — Vista IP Law Group, LLP

(57) ABSTRACT

A method and a system for converting a variable delay in real number modeling code to cycle-driven simulation interface event for digital/mixed signal emulation is provided. The method comprises identifying a variable delay of an analog signal in real number modeling code defining an analog circuit; determining a frequency and a maximum number of cycles for a series of discrete clock cycles, wherein the variable delay corresponds to one cycle in the series of discrete clock cycles; converting the variable delay into a plurality of cycle-driven discrete events based on the series of discrete clock cycles; and generating synthesizable code based on the plurality of cycle-driven discrete events for digital mixed signal emulation. A system and a non-transitory computer readable medium to perform the above method are also provided.

20 Claims, 5 Drawing Sheets

(56) References Cited

U.S. PATENT DOCUMENTS

| | | | |
|---|---|---|---|
| 2002/0123871 A1* | 9/2002 | Klaus et al. | G06F 17/5022 703/14 |
| 2002/0141490 A1* | 10/2002 | Chen et al. | H03H 17/0254 375/152 |
| 2004/0025073 A1* | 2/2004 | Soufi et al. | G06F 17/5022 713/400 |
| 2005/0102643 A1* | 5/2005 | Hou et al. | G06F 1/10 716/104 |
| 2008/0072197 A1* | 3/2008 | Ja et al. | G06F 17/5031 716/103 |
| 2008/0195363 A1* | 8/2008 | Lytollis | G06F 17/5036 703/3 |
| 2009/0182545 A1* | 7/2009 | Walter et al. | G06F 17/5031 703/15 |
| 2011/0140748 A1* | 6/2011 | Sikka et al. | G06F 17/5045 327/158 |
| 2014/0132304 A1* | 5/2014 | Haiut | H03M 1/00 326/52 |
| 2015/0201052 A1* | 7/2015 | Li et al. | H04M 1/0266 455/566 |
| 2018/0181684 A1* | 6/2018 | Fredenburg et al. | G06F 30/3312 |

* cited by examiner

400

```
┌─────────────────────────────────────┐
│ IDENTIFY A VARIABLE DELAY OF AN     │
│ ANALOG SIGNAL IN HARDWARE           │
│ DESCRIPTION LANGUAGE CODE           │
│                 410                 │
└─────────────────────────────────────┘
                  ↓
┌─────────────────────────────────────┐
│ DETERMINE A FREQUENCY AND MAXIMUM   │
│ NUMBER OF CYCLES FOR A SERIES OF    │
│ DISCRETE CLOCK CYCLES, WHEREIN THE  │
│ VARIABLE DELAY IS MAPPED TO ONE     │
│ CYCLE OF THE SERIES OF DISCRETE     │
│ CLOCK CYCLES                        │
│                 420                 │
└─────────────────────────────────────┘
                  ↓
┌─────────────────────────────────────┐
│ CONVERT THE VARIABLE DELAY INTO A   │
│ PLURALITY OF CYCLE-DRIVEN DISCRETE  │
│ EVENTS BASED ON THE SERIES OF       │
│ DISCRETE CLOCK CYCLES               │
│                 430                 │
└─────────────────────────────────────┘
                  ↓
┌─────────────────────────────────────┐
│ GENERATE SYNTHESIZABLE CODE BASED   │
│ ON THE PLURALITY OF CYCLE-DRIVEN    │
│ DISCRETE EVENTS FOR DIGITAL         │
│ EMULATION                           │
│                 440                 │
└─────────────────────────────────────┘
```

FIG. 4

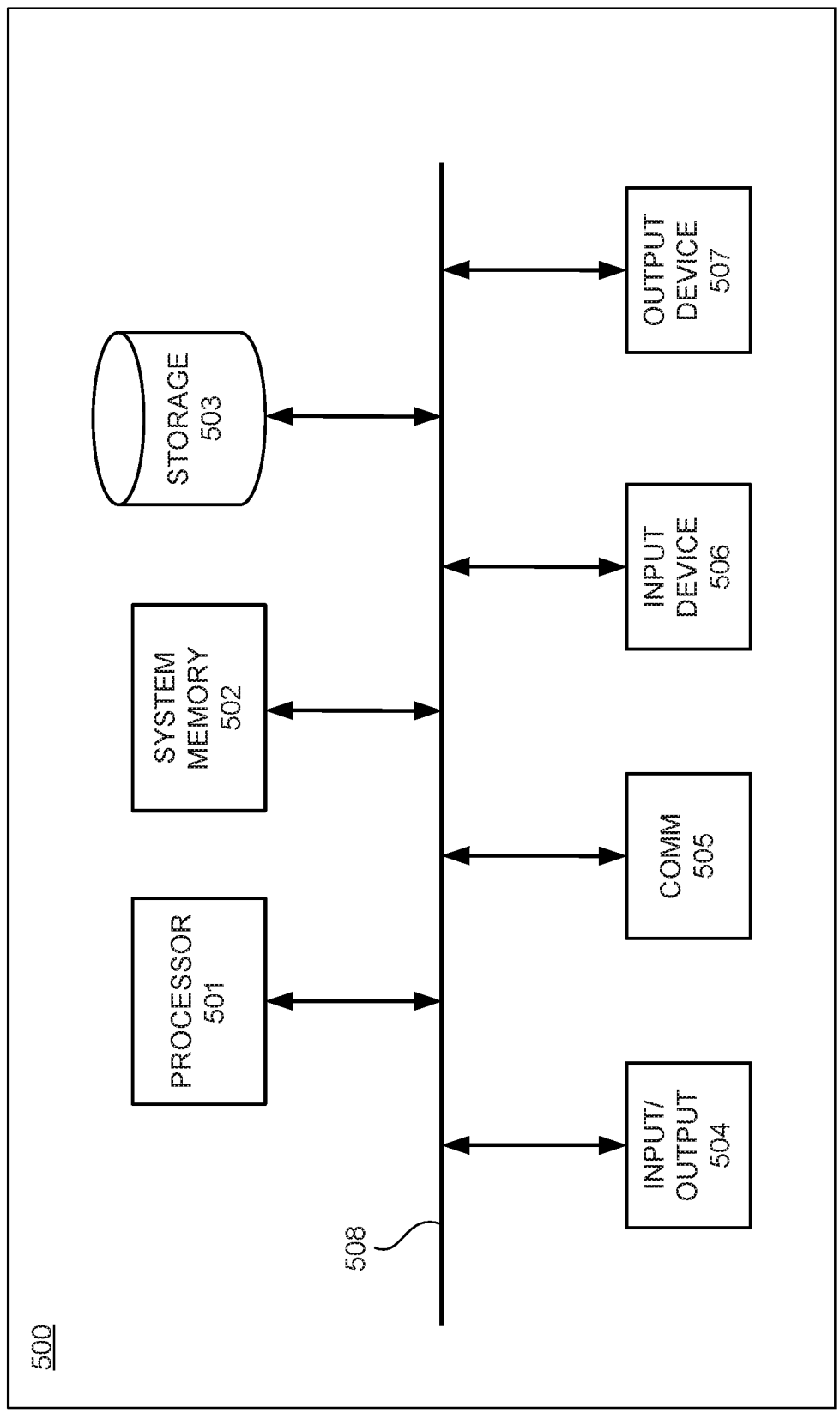

CONVERTING ANALOG VARIABLE DELAY IN REAL NUMBER MODELING CODE TO CYCLE-DRIVEN SIMULATION INTERFACE CODE

TECHNICAL FIELD

The subject technology generally relates to circuit design emulation, and particularly to the conversion of analog variable delay in real number modeling code to cycle-driven simulation interface code for digital/mixed-signal emulation.

BACKGROUND

Full chip integration tasks in modem Very Large System Integration (VLSI) commonly include integration of a digital part, an analog part, and a power intent and software (SW) and are commonly performed in simulation. For the simulation, usually a real number model (RNM) of the analog part is used to increase simulation speed. In some cases the simulation speed is not fast enough to achieve the integration target, including cases like pre-silicon SW development with high interaction between the SW and the analog part, or cases like long algorithms that involve digital design (with or without SW) and analog design. The standard solution to accelerate simulation speed in these cases is to run on an emulator. However, emulators typically run synthesizable code only. Therefore, some approaches include manual conversion of analog emulation tools into synthesizable code compatible with digital emulation tools. These manual techniques are time consuming (up to several days or even weeks to complete a system level emulation), subjective, inaccurate, and difficult to generalize and re-use for different circuit configurations.

The description provided in the background section should not be assumed to be prior art merely because it is mentioned in or associated with the background section. The background section may include information that describes one or more aspects of the subject technology.

SUMMARY

In certain aspects, a method for converting analog variable delay in real number modeling code to cycle-driven simulation interface code for digital mixed-signal emulation is described. The method comprises identifying, in real number modeling code defining an analog circuit, a variable delay of an analog signal; determining a frequency and a maximum number of cycles for a series of discrete clock cycles, wherein the variable delay corresponds to one cycle in the series of discrete clock cycles; converting the variable delay into a plurality of cycle-driven discrete events based on the series of discrete clock cycles; and generating synthesizable code based on the plurality of cycle-driven discrete events for digital mixed signal emulation. In some aspects, the plurality of cycle-driven discrete events are coded in cycle-driven simulation interface code. In some aspects, the variable delay is converted into the plurality of cycle-driven discrete events, each with a condition of a bit set in the shift register corresponding to a clock cycle. In some aspects, the series of discrete clock cycles are implemented with a shift register with a bit-length equal to the maximum number of cycles, and wherein the shift register shifts a bit at each clock cycle. In some aspects, the maximum number of cycles for the series of discrete clock cycles corresponds to a maximum delay of the analog signal. In some aspects, the frequency for the series of discrete clock cycles is higher than Nyquist sampling rate of the analog signal. In some aspects, the variable delay is a function of a state of the analog circuit and of a non-fixed value.

In certain aspects, a system for converting analog variable delay in real number modeling code to cycle-driven simulation interface code for digital mixed-signal emulation is described. The system includes a memory storing computer code, and at least one processor that executes the computer code to identify, in real number modeling code defining an analog circuit, a variable delay of an analog signal; determine a frequency and a maximum number of cycles for a series of discrete clock cycles, wherein the variable delay corresponds to one cycle in the series of discrete clock cycles; convert the variable delay into a plurality of cycle-driven discrete events based on the series of discrete clock cycles, wherein the series of discrete clock cycles are implemented with a shift register having a bit-length equal to the maximum number of cycles; and generate synthesizable code based on the plurality of cycle-driven discrete events for digital mixed signal emulation.

In certain aspects, a non-transitory, machine-readable storage medium is described that includes machine-readable instructions for causing a processor to execute a method. The method comprises identifying, in real number modeling code defining an analog circuit, a variable delay of an analog signal; determining a frequency and a maximum number of cycles for a series of discrete clock cycles, wherein the variable delay corresponds to one cycle in the series of discrete clock cycles; converting the variable delay into a plurality of cycle-driven discrete events in cycle-driven simulation interface code based on the series of discrete clock cycles; and generating synthesizable code for the variable delay based on the plurality of cycle-driven discrete events in cycle-driven simulation interface code for digital mixed signal emulation.

In certain aspects, a system is described including a means for storing computer code. The system further includes a means to execute the computer code for identifying, in real number modeling code defining an analog circuit, a variable delay of an analog signal; for determining a frequency and a maximum number of cycles for a series of discrete clock cycles, wherein the variable delay corresponds to one cycle in the series of discrete clock cycles; for converting the variable delay into a plurality of cycle-driven discrete events based on the series of discrete clock cycles; and for generating synthesizable code based on the plurality of cycle-driven discrete events for digital mixed signal emulation.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 4 is a flowchart illustrating an example process for converting a non-fixed variable time delay to a series of discreet clock cycles for DMS emulation, in accordance with aspects of the subject technology.

FIG. 5 is a block diagram illustrating an example computer system for converting a non-fixed variable time delay to a series of discreet clock cycles for DMS emulation, according to some embodiments.

In the figures, elements and steps denoted by the same or similar reference numerals are associated with the same or similar elements and steps, unless indicated otherwise.

DETAILED DESCRIPTION

Figure 1:
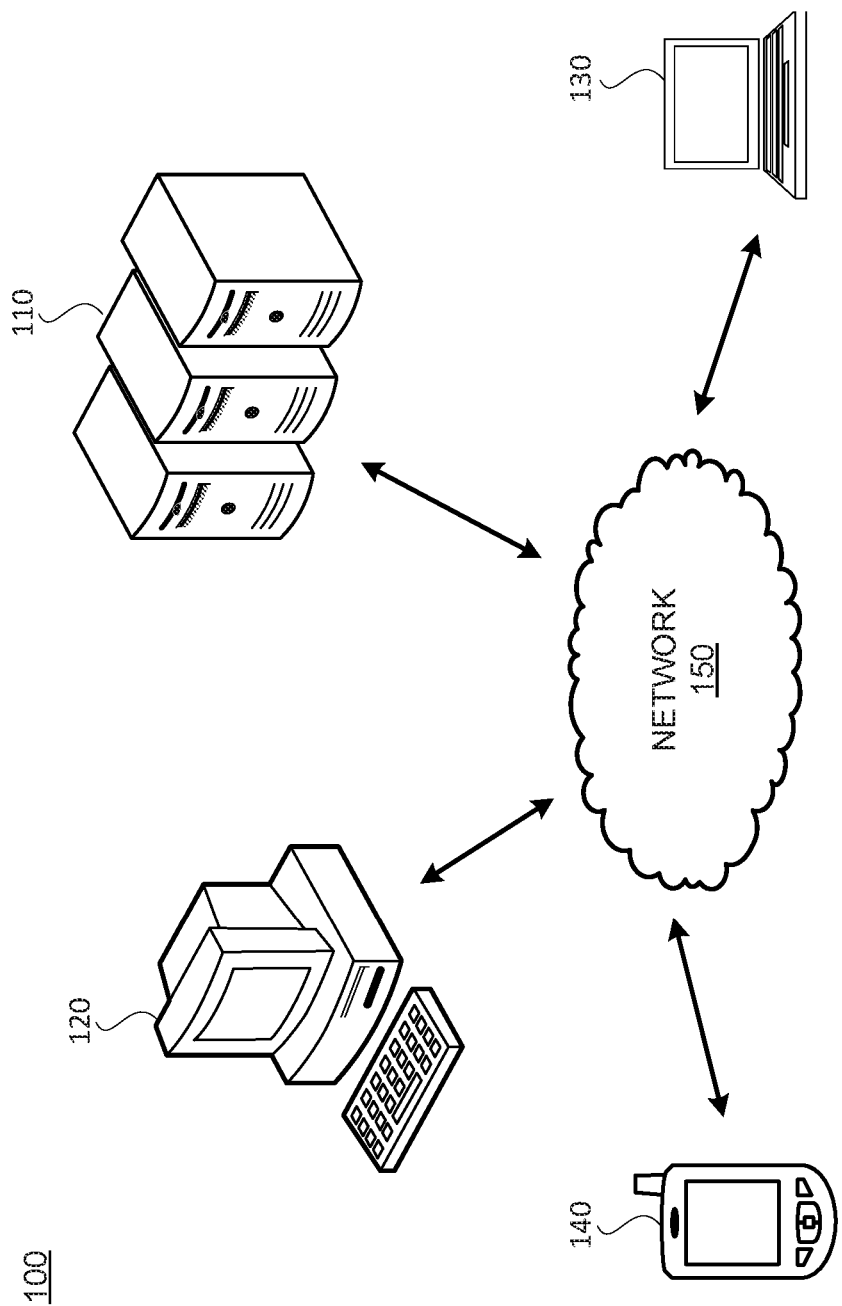
FIG. 1 illustrates an example environment for digital/mixed-signal (DMS) emulation, in accordance with aspects of the subject technology.

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Digital/mixed signal (DMS) system level verification may involve the combination of components, such as analog design, digital design, power intent, and embedded software. Traditional emulation tools for analog design use real number modeling (RNM) code, which typically runs at a much slower rate than emulation tools for digital design (e.g., Verilog). For example, some analog verification tools running RNM code may complete iteration cycles at a rate of several kHz (~$10^3$ iterations per second), while emulation tools for digital circuits may complete iteration cycles at a rate of several MHz (~$10^6$ iterations per second). It is desirable to have an emulation tool that provides efficient computation in many scenarios of a DMS system. The bottleneck for a quick system level DMS emulation can be the handling of analog components in the design.

One desirable solution is to convert RNM code into cycle-driven simulation interface code (e.g., system-C) that can be used in digital emulation tools. System-C is an extension of the C++ language that allows the user to control signal timing and device ports. The cycle-driven simulation interface converts the time it takes to complete each operation in the RNM processes into multiple clock cycles. Digital emulation tools consistent with the present disclosure may include a high level synthesis tool (HLS) that further converts cycle-driven simulation interface codes to synthesizable RTL codes (e.g., Verilog-RTL code). Synthesizable RTL codes include standard logic cells like flip-flops and other standard cells ('OR,' 'NOT,' 'AND,' 'NOR,' 'NAND') used in Boolean logic calculations to be performed at a gate level in a digital circuit under a pre-determined number of clock cycles. Thus, the subject technology disclosed herein incorporates analog emulation into digital emulation tools at speeds several orders of magnitude faster than traditional analog verification tools.

Some of the challenges faced in converting RNM code to cycle-driven simulation interface code include translating non-fixed time delay in event-driven RNM processes to cycle-driven processes. The subject technology disclosed herein addresses this technical challenge and provides a solution by associating a shift register with a clock and accurately mapping the non-fixed delay to a series of cycle-driven discreet events, thus allowing a digital simulation interface to incorporate analog logic into an efficient system simulation.

Example System Architecture

FIG. 1 illustrates an example environment 100 for digital/mixed-signal (DMS) emulation in accordance with aspects of the subject technology. The environment 100 includes a server farm 110, a workstation 120, a mobile computer 130, and a mobile device 140 (e.g., a smartphone or tablet). The server farm 110 can include any servers having appropriate processors, memory, and communications capability for hosting electronic design automation (EDA) applications and/or electronic (e.g., logic circuit) design verification services. The workstation 120, the workstation 130, and the mobile device 140 may each include EDA client applications. In certain aspects, one or more servers of the server farm 110 can be a cloud computing server of an infrastructure-as-a-service (IaaS) and be able to support a platform-as-a-service (PaaS) and software-as-a-service (SaaS) services.

Users of the workstation 120, the mobile computer 130, or the mobile device 140 can access and support the EDA applications on the server farm 110 through the EDA client applications on the users' device to design, verify and simulate logic circuits or integrated circuits. In some aspects, the EDA and the electronic design verification applications may reside on the workstation 120, the mobile computer 130, or the mobile device 140. The users may access the EDA and the electronic design verification applications on the workstation 120, the mobile computer 130, or the mobile device 140.

The server farm 110, workstation 120, mobile computer 130, and mobile device 140 are interconnected via a network 150 in the environment 100. The network 150 can include, for example, any one or more of a personal area network (PAN), a local area network (LAN), a campus area network (CAN), a metropolitan area network (MAN), a wide area network (WAN), a virtual private network (VPN), a broadband network (BBN), the Internet, and the like. Further, the network 150 can include, but is not limited to, any one or more of the following network topologies, including a bus network, a star network, a ring network, a mesh network, a star-bus network, a tree or hierarchical network, and the like.

Figure 2:
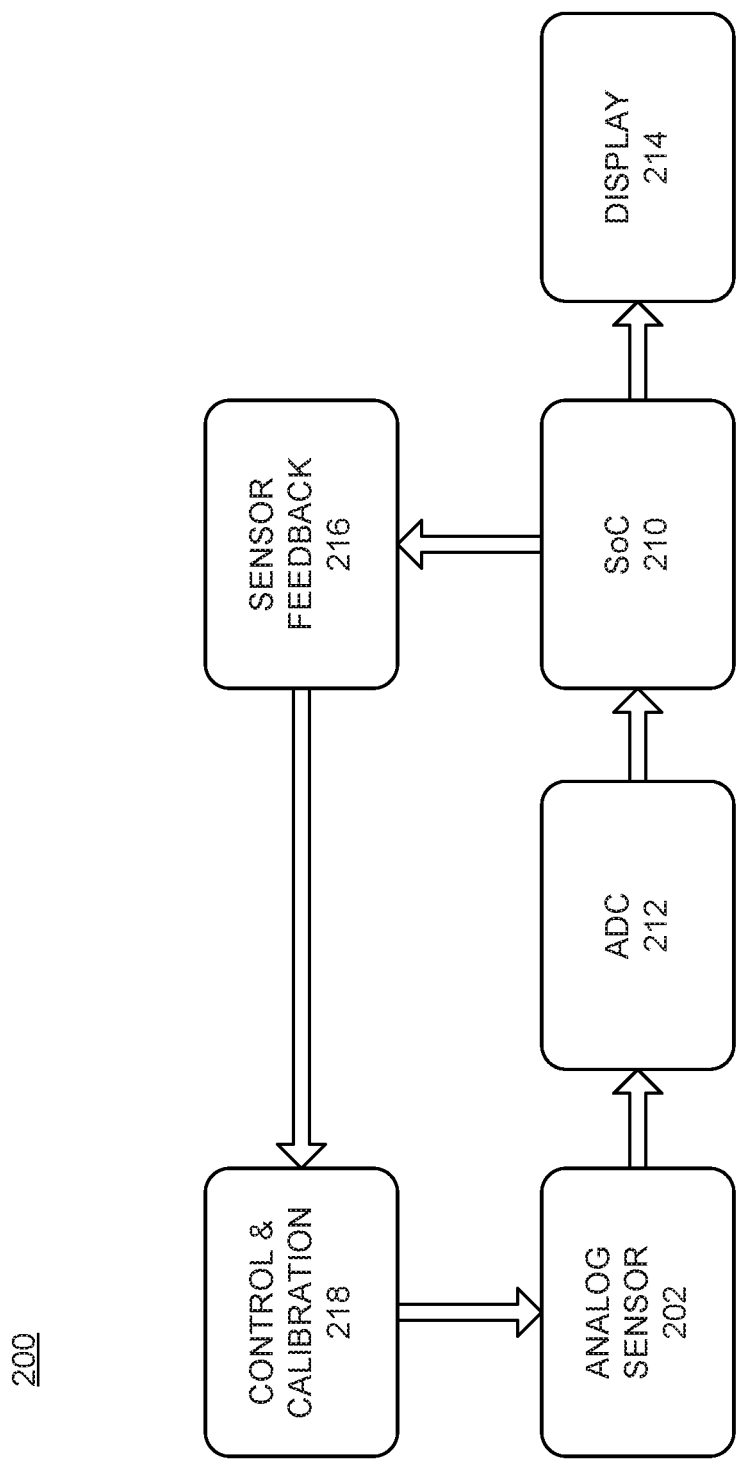
FIG. 2 illustrates an example system including analog and digital components for DMS emulation, in accordance with aspects of the subject technology.

FIG. 2 illustrates an example system 200, including analog and digital components for DMS emulation, in accordance with aspects of the subject technology. The system 200 includes an analog sensor 202 coupled to a system on a chip (SoC) 210 through an analog to digital converter (ADC) 212. The SoC 210 may provide a digital input signal to a display 214, and a signal to a sensor feedback block 216. Sensor feedback block 216 may be coupled to a control and calibration block 218 that provides a gain/frame control and calibration signal to sensor 202. In some implementations, the display 214, sensor feedback block 216, and control and calibration block 218 include digital circuitry.

The system 200 may represent, for example, a circuit design for a digital camera, a digital voice recorder, a heart rate monitor, and a smart watch, among other devices. These devices may include analog sensors for monitoring various analog signals such as optical, sound, electrocardiogram, and thermal signals. After the A/D conversion, these signals are processed and displayed in digital format. Current electronic circuit or IC design may include embedded software (SW) commands in SoC 210, which may be able to adjust the configuration of the analog components (e.g., of sensor 202) dynamically. Accordingly, emulation tools as disclosed herein fully incorporate digital and analog components to test the behavior of a DMS system 200.

Figure 3:
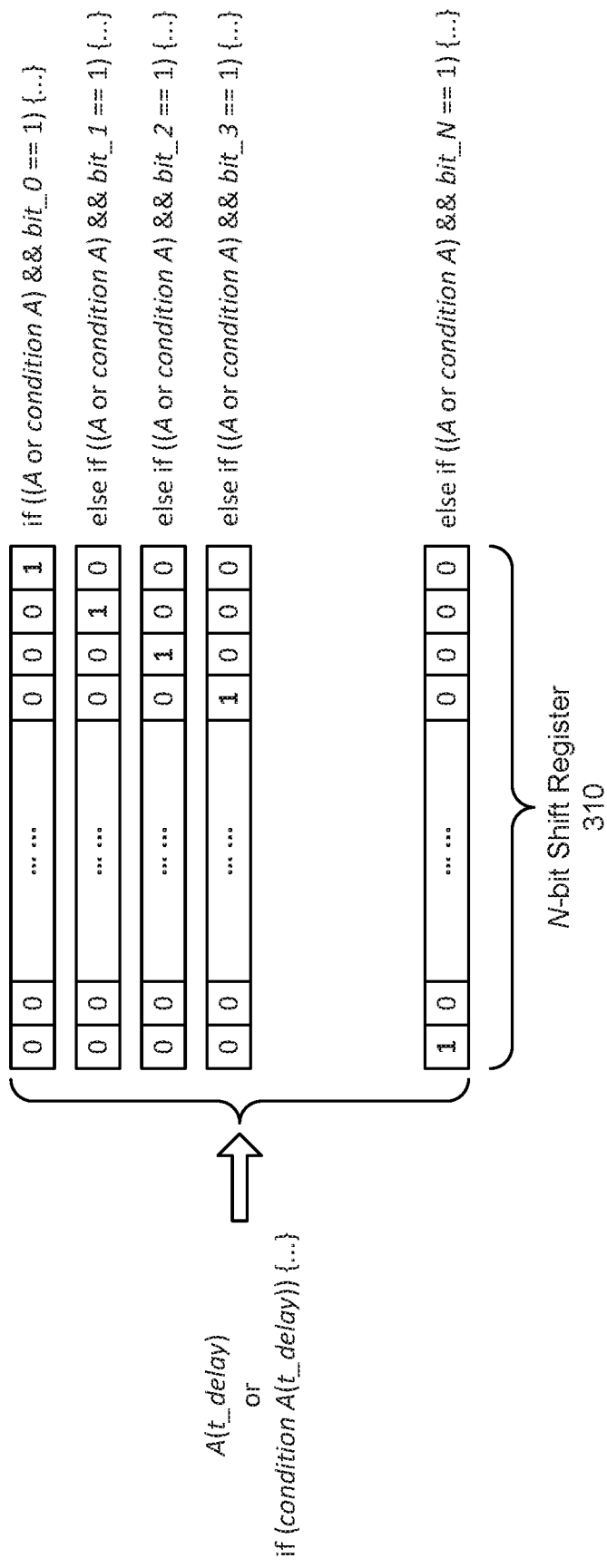
FIG. 3 illustrates an example process for converting a non-fixed variable time delay to a series of discreet clock cycles for DMS emulation, in accordance with aspects of the subject technology.

FIG. 3 illustrates an example process 300 for converting a non-fixed variable time delay to a series of discreet clock cycles for DMS emulation, in accordance with aspects of the subject technology. The real number modeling (RNM) code models the behaviors of analog systems with event-driven processes, while events in cycle-driven simulation interface code, such as System-C, are driven by clock cycles. Occurrence of delays in RNM processes may often be a function of the system states among other parameters. For example, a part of the circuit may be active only when an input voltage reaches a certain level, or an alarm signal is triggered when an input current crosses a threshold. Therefore, the delays may not be estimated or determined a priori and may vary under different system states.

In one or more implementations, a shift register associated with clock cycles can be utilized to accurately map a non-fixed and variable delay to a series of cycle-driven discreet events. As depicted in FIG. 3, a bit set in an N-bit shift register 310 shifts by one position from right to left in synchronization with the clock cycles. When the input time delay, which may be a function of a signal or a condition A in RNM code, "passes through" the shift register, a series of discreet events can be generated. For example, detecting the signal or condition A when bit_0 is set corresponds to an event of signal or condition A at clock cycle 0, i.e., no delay; and signal or condition A detected with bit_3 set maps to an event of signal or condition A at the third clock cycle, i.e., a delay or three clock cycles. Generally, detecting the signal or condition A when bit_n is set corresponds to an event of signal or condition A at clock cycle n, i.e., a delay of n-cycles. Hence, the shift register 310 essentially functions like a 1-to-N multiplexer/demultiplexer (or a mux/demux) that taking the input delay and translating/mapping it to one of many possible clock cycles.

Based on the N-bit shift register 310 in FIG. 3, a total number of N branches of events may be generated in the cycle-driven simulation interface code for converting the time delay from the RNM code. The maximum delay that the N-bit shift register 310 can emulate is therefore calculated as N multiplied by the period of each clock cycle. In some aspects of the subject technology, the period or the frequency of the clock cycle is chosen to be higher than the Nyquist sampling rate (for alias-free signal sampling) of the input signal A, and the size of the shift register N selected such that the maximum delay can be covered. During the DMS emulation, the non-fixed and variable delay of the signal/condition A may be mapped to one of the N branches of events that correspond to the actual delay of A in the DMS system.

FIG. 4 is a flowchart illustrating an example process 400 for converting a non-fixed variable time delay to a series of discreet clock cycles for DMS emulation, in accordance with aspects of the subject technology. At least some of the steps in process 400 may be performed by a computing system having one or more processors executing commands stored in a memory of the computing system. Further, steps as disclosed in process 400 may include retrieving, editing, and/or storing files in a database that is part of, or is communicably coupled to, the computing system. Methods consistent with the present disclosure may include at least some, but not all, of the steps illustrated in process 400 performed in a different sequence. Furthermore, methods consistent with the present disclosure may include at least two or more steps as in process 400 performed overlapping in time, or almost simultaneously.

The computing system for converting a variable delay in RNM code to cycle-driven discreet events in simulation interface code first identifies, in step 410, a variable delay of an analog signal in hardware description language (HDL) code. The HDL code can be, for example, RNM code that describes the behaviors of analog circuits including event-driven processes. The variable delay may be a function of a signal or a condition that depends on the state of the analog circuits.

Next, in step 420, the computing system determines a frequency and a maximum number of cycles for a series of discrete clock cycles. The identified variable delay can be mapped to one cycle in the series of discrete clock cycles. In one or more implementations, a shift register associated with clock cycles may be applied for accurately mapping the non-fixed and variable delay. The shift register may have a bit length equal to the determined maximum number of cycles, so that the one bit in the shift register shifts a position at each clock cycle.

The computing system subsequently converts, in step 430, the variable delay into a plurality of cycle-driven discrete events based on the series of discrete clock cycles. For example, using the shift register of a bit-length of N, a maximum number of N branches of events may be generated in the cycle-driven simulation interface code for the time delay in the RNM code.

Finally, in step 440, synthesizable code can be generated based on the plurality of cycle-driven discrete events for DMS emulation. For example, the synthesizable code may include synthesizable RTL codes (e.g., Verilog-RTL code) converted from the cycle-driven simulation interface code for DMS emulation.

Hardware Overview

FIG. 5 is a block diagram illustrating an example computer system 500 with which the methods and steps illustrated in processes 300 and 400 can be implemented, according to some embodiments. In some aspects, the computer system 500 may represent the server farm 110, the computing device 120, the mobile computer 130, and the mobile device 140 of FIG. 1. In certain aspects, computer system 500 can be implemented using hardware or a combination of software and hardware, either in a dedicated server, integrated into another entity, or distributed across multiple entities.

Computer system 500 (e.g., servers in server farm 110, workstation 120, the mobile computer 130, the mobile device 140) includes a bus 508 or other communication mechanism for communicating information, and a processor 501 coupled with bus 508 for processing information. According to one aspect, the computer system 500 can be a cloud computing server of an IaaS that is able to support PaaS and SaaS services. According to one aspect, the computer system 500 is implemented as one or more special-purpose computing devices. The special-purpose computing device may be hard-wired to perform the disclosed techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques. By way of example, the computer system 500 may be implemented with one or more processors 501. Processor 501 may be a general-purpose microprocessor, a microcontroller, a Digital Signal Processor (DSP), an ASIC, a FPGA, a Programmable Logic Device (PLD), a controller, a state machine, gated logic, discrete hardware component, or any other suitable entity that can perform calculations or other manipulations of information.

Computer system 500 can include, in addition to hardware, code that creates an execution environment for the computer program in question, e.g., code that constitutes processor firmware, a protocol stack, a database management system, an operating system, or a combination of one or more of them stored in an included memory 502, such as a Random Access Memory (RAM), a flash memory, a Read Only Memory (ROM), a Programmable Read-Only Memory (PROM), an Erasable PROM (EPROM), register, a hard disk, a removable disk, a CD-ROM, a DVD, or any other suitable storage device, coupled to bus 508 for storing information and instructions to be executed by processor 501. The processor 501 and the memory 502 can be supplemented by, or incorporated in, special purpose logic circuitry. Expansion memory may also be provided and connected to computer system 500 through input/output module 504, which may include, for example, a SIMM (Single In-line Memory Module) card interface. Such expansion memory may provide extra storage space for computer system 500, or may also store applications or other information for computer system 500. Specifically, expansion memory may include instructions to carry out or supplement the processes described above, and may include secure information also. Thus, for example, expansion memory may be provided as a security module for computer system 500, and may be programmed with instructions that permit secure use of computer system 500. In addition, secure applications may be provided via the SIMM cards, along with additional information, such as placing identifying information on the SIMM card in a non-hackable manner.

The instructions may be stored in the memory 502 and implemented in one or more computer program products, i.e., one or more modules of computer program instructions encoded on a computer readable medium for execution by, or to control the operation of, the computer system 500, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, embeddable languages, and xml-based languages. Memory 502 may also be used for storing temporary variable or other intermediate information during execution of instructions to be executed by processor 501.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 500 further includes a data storage device 503 such as a magnetic disk or optical disk, coupled to bus 508, for storing information and instructions. Computer system 500 may be coupled via input/output module 504 to various devices. The input/output module 504 can be any input/output module. Example input/output modules 504 include data ports such as USB ports. In addition, input/output module 504 may be provided in communication with processor 501, so as to enable near area communication of computer system 500 with other devices. The input/output module 504 may provide, for example, for wired communication in some implementations, or for wireless communication in other implementations, and multiple interfaces may also be used. The input/output module 504 is configured to connect to a communications module 505. Example communications modules 505 may include networking interface cards, such as Ethernet cards and modems.

The components of the system 500 can be interconnected by any form or medium of digital data communication, e.g., a communication network. The communication network (e.g., network 150 of FIG. 1) can include, for example, any one or more of a PAN, a LAN, a CAN, a MAN, a WAN, a BBN, the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

For example, in certain aspects, communications module 505 can provide a two-way data communication coupling to a network link that is connected to a local network. Wireless links and wireless communication may also be implemented. Wireless communication may be provided under various modes or protocols, such as Global System for Mobile Communications (GSM), Short Message Service (SMS), Enhanced Messaging Service (EMS), or Multimedia Messaging Service (MMS) messaging, Code Division Multiple Access (CDMA), Time division multiple access (TDMA), Personal Digital Cellular (PDC), Wideband CDMA, General Packet Radio Service (GPRS), or Long-Term Evolution (LTE), among others. Such communication may occur, for example, through a radio-frequency transceiver. In addition, short-range communication may occur, such as using a BLUETOOTH, WI-FI, near-field communications (NFC), or other such transceiver.

In any such implementation, communications module 505 sends and receives electrical, electromagnetic or optical signals that carry digital data streams representing various types of information. The network link typically provides data communication through one or more networks to other data devices. For example, the network link of the communications module 505 may provide a connection through local network to a host computer or to data equipment operated by an Internet Service Provider (ISP). The ISP in turn provides data communication services through the world wide packet data communication network now commonly referred to as the "Internet". The local network and Internet both use electrical, electromagnetic or optical signals that carry digital data streams. The signals through the various networks and the signals on the network link and through communications module 505, which carry the digital data to and from computer system 500, are example forms of transmission media.

Computer system 500 can send messages and receive data, including program code, through the network(s), the network link and communications module 505. In the Internet example, a server might transmit a requested code for an application program through the Internet, the ISP, the local network, and the communications module 505. The received code may be executed by processor 501 as it is received, and/or stored in data storage 503 for later execution.

In certain aspects, the input/output module 504 is configured to connect to a plurality of devices, such as an input device 506 and/or an output device 507. Example input devices 506 include a keyboard and a pointing device, e.g., a mouse or a trackball, by which a user can provide input to the computer system 500. Other kinds of input devices 506 can be used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; input from the user can be received in any form, including acoustic, speech, tactile, or brain wave input. Example output devices 507 include display devices such as a LED (light emitting diode), CRT (cathode ray tube), LCD (liquid crystal display) screen, a TFT LCD (Thin-Film-Transistor Liquid Crystal Display) or an OLED (Organic Light Emitting Diode) display, for displaying information to the user. The output device 507 may comprise appropriate circuitry for driving the output device 507 to present graphical and other information to a user.

According to one aspect of the present disclosure, the server 110, the work station 120, mobile computer 130, and mobile device 140 can be implemented using a computer system 500 in response to processor 501 executing one or more sequences of one or more instructions contained in memory 502. Such instructions may be read into memory 502 from another machine-readable medium, such as data storage device 503. Execution of the sequences of instructions contained in main memory 502 causes processor 501 to perform the process steps described herein. One or more processors in a multi-processing arrangement may also be employed to execute the sequences of instructions contained in memory 502. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

Computing system 500 can include clients and servers. A client and a server are generally remote from each other and typically interact through a communication network. The relationship of client and server arises by virtue of computer programs running on the respective computers and having a client-server relationship to each other. Computer system 500 can be, for example, and without limitation, a desktop computer, laptop computer, or tablet computer. Computer system 500 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer-readable medium" as used herein refers to any medium or media that participates in providing instructions or data to processor 501 for execution. The term "storage medium" as used herein refers to any non-transitory media that store data and/or instructions that cause a machine to operate in a specific fashion. Such media may take many forms, including, but not limited to, non-volatile media, volatile media, and transmission media. Non-volatile media include, for example, optical disks, magnetic disks, or flash memory, such as data storage device 503. Volatile media include dynamic memory, such as memory 502. Transmission media include coaxial cables, copper wire, and fiber optics, including the wires that comprise bus 508. Common forms of machine-readable media include, for example, floppy disk, flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

As used in this specification of this application, the terms "computer-readable storage medium" and "computer-readable media" are entirely restricted to tangible, physical objects that store information in a form that is readable by a computer. These terms exclude any wireless signals, wired download signals, and any other ephemeral signals. Storage media is distinct from but may be used in conjunction with transmission media. Transmission media participates in transferring information between storage media. For example, transmission media includes coaxial cables, copper wire and fiber optics, including the wires that comprise bus 508. Transmission media can also take the form of acoustic or light waves, such as those generated during radio-wave and infra-red data communications. Furthermore, as used in this specification of this application, the terms "computer," "server," "processor," and "memory" all refer to electronic or other technological devices. These terms exclude people or groups of people. For the purposes of the specification, the terms display or displaying means displaying on an electronic device.

In one aspect, a method may be an operation, an instruction, or a function and vice versa. In one aspect, a clause or a claim may be amended to include some or all of the words (e.g., instructions, operations, functions, or components) recited in one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C, any combination of A, B, and C, and/or at least one of each of A, B, and C.

In one aspect, a term, field effect transistor (FET), may refer to any of a variety of multi-terminal transistors generally operating on the principles of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the terms "include," "have," or the like are used in the description or the claims, such terms are intended to be inclusive in a manner similar to the terms "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike, are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. §112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method comprising:
    identifying, in real number modeling code at an electronic design automation application on a computing system, an analog circuit corresponding to an analog signal having a variable delay, wherein the real number modeling code models behavior of the analog circuit using an event-driven process and defines at least the analog circuit, and the variable delay depends on one or more parameter states at a time of operation;
    determining a maximum number of clock cycles at a given frequency for the variable delay of the analog signal, wherein the maximum number of clock cycles is at least two clock cycles and the variable delay is based on at least the one or more parameter states at the time of operation;
    converting, by the computing system having the electronic design automation application, the variable delay of the analog signal to a plurality of cycle-driven discrete events by:
        associating a shift register with a clock, wherein the shift register has a bit length equal to the maximum number of clock cycles for the variable delay of the analog signal;
        mapping the variable delay of the analog signal to respective cycles of the plurality of cycle-driven discrete events based on at least the one or more parameter states, by generating respective conditional statement for each position of the shift register, wherein respective conditional statements are to be evaluated during digital mixed signal emulation based on a value in a corresponding position in the shift register and at least one of the one or more parameter states at the time of operation; and
    generating synthesizable code for digital mixed signal emulation based on the mapping of the variable delay of the analog signal to the respective cycles of the plurality of cycle-driven discrete events, wherein the synthesizable code correlates the one or more parameter states to respective numbers of clock cycles for synthesis of the analog circuit as a series of cycle-driven discrete events, and the variable delay is determined during emulation by evaluating the respective conditional statements based on a value in a corresponding position in the shift register and at least one of the one or more parameter states.

2. The method of claim 1, wherein the variable delay further depends on a state of the analog circuit.

3. The method of claim 1, wherein the given frequency for the variable delay is higher than Nyquist sampling rate of the analog signal.

4. The method of claim 1, wherein the maximum number of cycles for the variable delay corresponds to a maximum delay of the analog signal.

5. The method of claim 1, wherein the shift register shifts a bit at each clock cycle at corresponding locations in the shift register.

6. The method of claim 1, wherein the synthesizable code comprises register transfer level code.

7. The method of claim 1, wherein the plurality of cycle-driven discrete events are coded in cycle-driven simulation interface code.

8. A system, comprising:
    a memory, storing computer code; and
    at least one processor that executes the computer code to:
        identifying, in real number modeling code at an electronic design automation application on a computing system an analog circuit corresponding to an analog signal having a variable delay, wherein the real number modeling code models behavior of the analog circuit using an event-driven process and defines at least the analog circuit and the variable delay depends on one or more parameter states at a time of operation;
        determining a maximum number of clock cycles at a given frequency for the variable delay of the analog signal, wherein the maximum number of clock cycles is at least two clock cycles and the variable delay is based on at least the one or more parameter states at the time of operation;
        converting, by the computing system having the electronic design automation application, the variable delay of the analog signal to a plurality of cycle-driven discrete events by:
            associating a shift register with a clock, wherein the shift register has a bit length equal to the maximum number of clock cycles for the variable delay of the analog signal;
            mapping the variable delay of the analog signal to respective cycles of the plurality of cycle-driven discrete events based on at least the one or more parameter states, by generating respective conditional statement for each position of the shift register, wherein respective conditional statements are to be evaluated during digital mixed signal emulation based on a value in a corresponding position in the shift register and at least one of the one or more parameter states at the time of operation; and
        generating synthesizable code for digital mixed signal emulation based on the mapping of the variable delay of the analog signal to the respective cycles of the plurality of cycle-driven discrete events, wherein the synthesizable code correlates the one or more parameter states to respective numbers of clock cycles for synthesis of the analog circuit as a series of cycle-driven discrete events, and the variable delay is determined during emulation by evaluating the respective conditional statements based on a value in a corresponding position in the shift register and at least one of the one or more parameter states.

9. The system of claim 8, wherein the variable delay further depends on a state of the analog circuit.

10. The system of claim 8, wherein the given frequency for the variable delay is higher than a Nyquist sampling rate of the analog signal.

11. The system of claim 8, wherein the maximum number of cycles for the variable delay corresponds to a maximum delay of the analog signal.

12. The system of claim 8, wherein the shift register shifts a bit at each clock cycle at corresponding locations in the shift register.

13. The system of claim 12, wherein the synthesizable code comprises register transfer level code.

14. The system of claim 8, wherein the plurality of cycle-driven discrete events are coded in cycle-driven simulation interface code.

15. A non-transitory computer-readable medium comprising instructions stored in a memory which, when executed by a processor, causes a set of acts, the set of acts comprising:
   identifying, in real number modeling code at an electronic design automation application on a computing system, an analog circuit corresponding to an analog signal having a variable delay, wherein the real number modeling code models behavior of the analog circuit using an event-driven process and defines at least the analog circuit and the variable delay depends on one or more parameter states at a time of operation;
   determining a maximum number of clock cycles at a given frequency for the variable delay of the analog signal, wherein the maximum number of clock cycles is at least two clock cycles and the variable delay is based on at least the one or more parameter states at the time of operation;
   converting, by the computing system having the electronic design automation application, the variable delay of the analog signal to a plurality of cycle-driven discrete events by:
      associating a shift register with a clock, wherein the shift register has a bit length equal to the maximum number of clock cycles for the variable delay of the analog signal;
      mapping the variable delay of the analog signal to respective cycles of the plurality of cycle-driven discrete events based on at least the one or more parameter states, by generating respective conditional statement for each position of the shift register, wherein respective conditional statements are to be evaluated during digital mixed signal emulation based on a value in a corresponding position in the shift register and at least one of the one or more parameter states at the time of operation; and
   generating synthesizable code for digital mixed signal emulation based on the mapping of the variable delay of the analog signal to the respective cycles of the plurality of cycle-driven discrete events, wherein the synthesizable code correlates the one or more parameter states to respective numbers of clock cycles for synthesis of the analog circuit as a series of cycle-driven discrete events, and the variable delay is determined during emulation by evaluating the respective conditional statements based on a value in a corresponding position in the shift register and at least one of the one or more parameter states.

16. The non-transitory computer-readable medium of claim 15, wherein the variable delay further depends on a state of the analog circuit.

17. The non-transitory computer-readable medium of claim 15, wherein the given frequency for the variable delay is higher than a Nyquist sampling rate of the analog signal.

18. The non-transitory computer-readable medium of claim 15, wherein the maximum number of cycles for the variable delay corresponds to a maximum delay of the analog signal.

19. The non-transitory computer-readable medium of claim 15, wherein the shift register shifts a bit at each clock cycle at corresponding locations in the shift register.

20. The non-transitory computer-readable medium of claim 19, wherein the synthesizable code comprises register transfer level code.

* * * * *